(12) United States Patent
Nakata

(10) Patent No.: US 10,101,365 B2
(45) Date of Patent: Oct. 16, 2018

(54) SEMICONDUCTOR MODULE, ELECTRICAL CONNECTOR, AND INSPECTION APPARATUS

(71) Applicant: KABUSHIKI KAISHA NIHON MICRONICS, Tokyo (JP)

(72) Inventor: Yoshiro Nakata, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 0 days.

(21) Appl. No.: 15/327,014

(22) PCT Filed: Jul. 16, 2015

(86) PCT No.: PCT/JP2015/003588
§ 371 (c)(1),
(2) Date: Jan. 17, 2017

(87) PCT Pub. No.: WO2016/009652
PCT Pub. Date: Jan. 21, 2016

(65) Prior Publication Data
US 2017/0168091 A1 Jun. 15, 2017

(30) Foreign Application Priority Data
Jul. 17, 2014 (JP) .................................. 2014-146427

(51) Int. Cl.
*G01R 31/28* (2006.01)
*G01R 1/073* (2006.01)

(52) U.S. Cl.
CPC ......... *G01R 1/07364* (2013.01); *G01R 31/28* (2013.01)

(58) Field of Classification Search
CPC ............................ G01R 1/07364; G01R 31/28
See application file for complete search history.

(56) References Cited

U.S. PATENT DOCUMENTS

2004/0125578 A1 7/2004 Konishi
2010/0079160 A1* 4/2010 Hernandez ........... G01R 31/001
324/754.27

(Continued)

FOREIGN PATENT DOCUMENTS

JP S61-288436 12/1986
JP 2005024253 A 1/2005

(Continued)

OTHER PUBLICATIONS

Notification of Examination Opinion for TW App No. 104123227 dated May 23, 2016, 8 pgs.

(Continued)

*Primary Examiner* — Jermele M Hollington
*Assistant Examiner* — Feba Pothen
(74) *Attorney, Agent, or Firm* — Procopio, Cory, Hargreaves & Savitch LLP

(57) ABSTRACT

A semiconductor module includes a control IC mounted on a mounting substrate and a plurality of semiconductor chips mounted on the mounting substrate, and each of the plurality of semiconductor chips includes first and second transistors connected in series between a device to be inspected and a tester. The first transistor and the second transistor have a common drain electrode on a substrate side of the semiconductor chip. A source electrode of the first transistor is connected to the side of a power supply channel of the tester. A source electrode of the second transistor is connected to the side of an electrode of the device to be inspected. A control signal from the control IC is supplied to a gate electrode of each of the first and second transistors via a line so that the connection between the tester and the device to be inspected is controlled.

10 Claims, 10 Drawing Sheets

(56) References Cited

U.S. PATENT DOCUMENTS

| | | | |
|---|---|---|---|
| 2010/0327898 A1 | 12/2010 | Ishigaki | |
| 2012/0286814 A1* | 11/2012 | Wang | G01R 1/07378 324/754.03 |
| 2013/0099812 A1* | 4/2013 | Wang | G01R 31/2889 324/755.01 |
| 2014/0028341 A1 | 1/2014 | Mikuni | |

FOREIGN PATENT DOCUMENTS

| | | |
|---|---|---|
| JP | 2010-156569 | 7/2010 |
| JP | 2011-007743 | 1/2011 |
| JP | 2014-025761 | 2/2014 |
| TW | 200428639 | 12/2004 |
| WO | 2013057857 | 4/2013 |

OTHER PUBLICATIONS

Notification of Reasons for Refusal for JP App No. 2016-534286 dated Sep. 6, 2017, 6 pgs.
Notification of Reasons for Refusal for JP App No. 2016-534286 dated Jun. 6, 2017, 6 pgs.
Office Action dated Feb. 1, 2018 for the corresponding Korean Patent Application No. 10-2017-7004049, 11 pages.

* cited by examiner

SEMICONDUCTOR MODULE, ELECTRICAL CONNECTOR, AND INSPECTION APPARATUS

CROSS-REFERENCE TO RELATED APPLICATIONS

This application is a U.S. National Stage entry of PCT Application No. PCT/JP2015/003588, filed on Jul. 16, 2015, which claims priority to JP Application No. 2014-16427, Jul. 17, 2014. The contents of the foregoing are incorporated by reference.

TECHNICAL FIELD

The present invention relates to a semiconductor module, an electrical connector, and an inspection apparatus.

BACKGROUND ART

An inspection apparatus is used for electrical inspection (e.g., a wafer test, a package test or the like) of semiconductor devices (e.g., a chip on the wafer or an IC that has been assembled). The inspection apparatus includes a tester, an electrical connector that is electrically interposed between a test head of the tester and a device to be inspected, and a handling apparatus (e.g., a prober or a handler) that aligns the device to be inspected with respect to the electrical connector and causes the device to be inspected to come in contact with the electrical connector.

The electrical inspection of the semiconductor device includes a conduction test, a DC test, an AC test, a function test and the like. The tester includes a function of applying a current, a voltage, a signal and the like that are necessary for these tests (hereinafter they will also be referred to as a test power supply) and measuring electrical characteristics of the voltage, the current, output signal characteristics and the like at the time they are applied. The tester includes a plurality of channels for the application and the measurement (hereinafter these channels will also be referred to as power supply channels) so that the plurality of semiconductor devices can be simultaneously inspected.

The electrical connector includes, for example, a probe card, an IC socket, a DUT board, an insert ring, a performance board, or a connector in which the functions thereof are combined and integrated with each other.

The probe card is an electrical connector used for a wafer test. The probe card has one surface provided with a connection terminal connected to the test head of the tester directly or via a relaying electrical connector and another surface provided with a plurality of probes that contact electrodes (pads) of the device to be inspected. The plurality of probes then contact the pads so that the test power supply from the tester can be supplied to the semiconductor device.

Furthermore, a probe card including a power supply relay provided therein has been developed. Patent Literature 1 discloses, for example, a probe card including a power supply wiring portion that branches a power supply path from a tester into a plurality of paths and including power supply relays on the respective paths that have been branched. The opening and closing of the power supply relay is controlled by a control mechanism portion so that the IC chip to be inspected can be switched.

Accordingly, the plurality of power supply relays provided in one power supply wiring portion are selectively turned on so that the power supply from one power supply channel is supplied to the plurality of IC chips in turn. It is therefore possible to increase the number of IC chips to be inspected.

Further, a technique that uses a Metal Oxide Semiconductor (MOS) transistor is disclosed as a switch element that can be used for the power supply relay or the like (Patent Literature 2). Patent Literature 2 shows an example of a semiconductor device inspection apparatus capable of arbitrarily switching connections between measurement apparatuses that measure characteristics of semiconductor elements and probe needles connected to external connection terminals of a semiconductor device under a test using a switching matrix LSI formed of MOS transistor elements. In this switching matrix LSI, a plurality of conducting paths connected to the measurement apparatuses and a plurality of conducting paths connected to the probe needles are arranged in the form of a matrix. Further, the switching matrix LSI includes switches that are provided in the respective intersections of the conducting paths and switch ON and OFF, a row/column selection circuit that selects a row to be connected (conducting paths that lead to the probe needles) and a column (a plurality of conducting paths that lead to the measurement apparatuses), a signal line that transmits the output of the row/column selection circuit to the switch, and a column selection circuit that connects the conducting path of the column selected in the row/column selection circuit and the measurement apparatus. A large number of MOS transistor elements are used for the switch, the row/column selection circuit, and the column selection circuit, and the coupling between the probe needle and the measurement apparatus is switched by these MOS transistors.

CITATION LIST

Patent Literature

[Patent Literature 1] Japanese Unexamined Patent Application Publication No. 2011-7743
[Patent Literature 2] Japanese Unexamined Patent Application Publication No. 61-288436

SUMMARY OF INVENTION

Technical Problem

Patent Literature 1 discloses a configuration in which power supply relays are used as switches to switch a target to be inspected. However, when the switch is used to switch the target to be inspected as disclosed in Patent Literature 1, the number of switches to be used increases as the number of targets to be inspected increases. The increase in the number of switches causes an increase in power consumption of the whole switch and an increase in the heat generation amount.

Accordingly, when the switch is provided near the wafer or the probe card, this heat generation amount may affect the wafer or the probe card. Control of the temperature of the wafer or the probe card may be interrupted, for example, or the wafer or the probe card may be thermally expanded, which may affect the positional accuracy of the probes.

Further, while the MOS transistor is used as the switch in Patent Literature 2, a parasitic diode is formed in the MOS transistor in view of the structure of the MOS transistor. Therefore, when the MOS transistor is used independently, the current cannot be bidirectionally interrupted. Further, in the MOS transistor, a protection circuit needs to be provided between the gate and the source to protect the gate oxide film. A protective diode such as a schottky diode is provided, for example, between the gate and the source. However, this protective diode causes a leak current generated between the gate and the source. When this leak current flows through the device or the tester, this may cause a reduction in the accuracy of measuring the current.

The present invention has been made in view of the aforementioned problems and aims to provide a semiconductor module, an electrical connector, and an inspection apparatus capable of performing an accurate inspection.

Solution to Problem

A semiconductor module according to one aspect of the present invention is a semiconductor module used for an electrical connector that is electrically interposed between an electrode of a device to be inspected and a power supply channel of a tester, the semiconductor module including: a mounting substrate that includes a line; a control IC mounted on the mounting substrate; and a plurality of semiconductor chips mounted on the mounting substrate, in which: each of the plurality of semiconductor chips includes first and second transistors that are connected in series between the side of the electrode of the device to be inspected and the side of the power supply channel of the tester, the first transistor and the second transistor include a common first electrode on a substrate side of the semiconductor chip, a second electrode of the first transistor is connected to the side of the power supply channel of the tester and a second electrode of the second transistor is connected to the side of the electrode of the device to be inspected, and a control signal from the control IC is supplied to a control electrode of the first transistor and that of the second transistor via the line so that the connection between the side of the power supply channel of the tester and the side of the electrode of the device to be inspected is controlled. It is therefore possible to perform an accurate inspection.

In the aforementioned semiconductor module, the first and second transistors may be power MOS transistors, and the first electrode may be a drain electrode, the second electrode may be a source electrode, and the control electrode may be a gate electrode. It is therefore possible to achieve a simple mounting.

In the aforementioned semiconductor module, the control IC may include a CMOS and a control signal from the control IC may be an output from the CMOS. It is therefore possible to control the semiconductor module using the control signal output from the CMOS.

In the aforementioned semiconductor module, a chip column in which two or more semiconductor chips are arranged along a first direction may be provided on the mounting substrate, and the first and second transistors may be arranged along the first direction in each of the two or more semiconductor chips included in the chip column. It is therefore possible to improve the mounting density.

In the aforementioned semiconductor module, the second electrode of the semiconductor chip and a pad connected to the control electrode may be provided on the mounting substrate, a pad column including a plurality of pads arranged along the first direction may be provided on the mounting substrate, the pad column may be arranged between two chip columns, and the second electrode and the control electrode of the semiconductor chip included in the two chip columns may be connected to the pads included in the pad column. It is therefore possible to improve the mounting density.

In the aforementioned semiconductor module, a gate protection circuit is not preferably provided between the control terminal and the second terminal of the semiconductor chip. It is therefore possible to reduce the leak current and to perform an accurate inspection.

In the aforementioned semiconductor module, a line from an output terminal of the control IC to the control electrode of the semiconductor chip is not preferably connected to the first electrode and the second electrode of the semiconductor chip. It is therefore possible to reduce the leak current and to perform an accurate inspection.

A semiconductor module according to one aspect of the present invention includes: a mounting substrate including a line, a control IC mounted on the mounting substrate; and a plurality of semiconductor chips mounted on the mounting substrate, in which: each of the plurality of semiconductor chips includes first and second transistors connected in series between the probe and a power supply channel of the tester, the first transistor and the second transistor include a common first electrode on a substrate side of the semiconductor chip, a second electrode of the first transistor is connected to the first terminal and a second electrode of the second transistor is connected to the second terminal, and a control signal from the control IC is supplied to a control electrode of the first transistor and that of the second transistor via the line so that a connection between the first terminal and the second terminal is controlled. It is therefore possible to improve the mounting density.

An electrical connector according to one aspect of the present invention includes: the semiconductor module stated above; an interface substrate on which the semiconductor module is mounted; and a probe substrate including a plurality of probes connected to the second electrode of the second transistor. It is therefore possible to perform an accurate inspection.

In the aforementioned electrical connector, a connection terminal of a probe connected to the semiconductor module may be located just below the semiconductor module. It is therefore possible to connect a large number of semiconductor modules and a large number of probes in a short distance.

An inspection apparatus according to one aspect of the present invention includes: the electrical connector stated above; and a tester that supplies a test power supply to the electrical connector from a power supply channel. It is therefore possible to perform an accurate inspection.

Advantageous Effects of Invention

According to the present invention, it is possible to provide a semiconductor module, an electrical connector, and an inspection apparatus capable of performing an accurate inspection.

DESCRIPTION OF EMBODIMENTS

Figure 1:
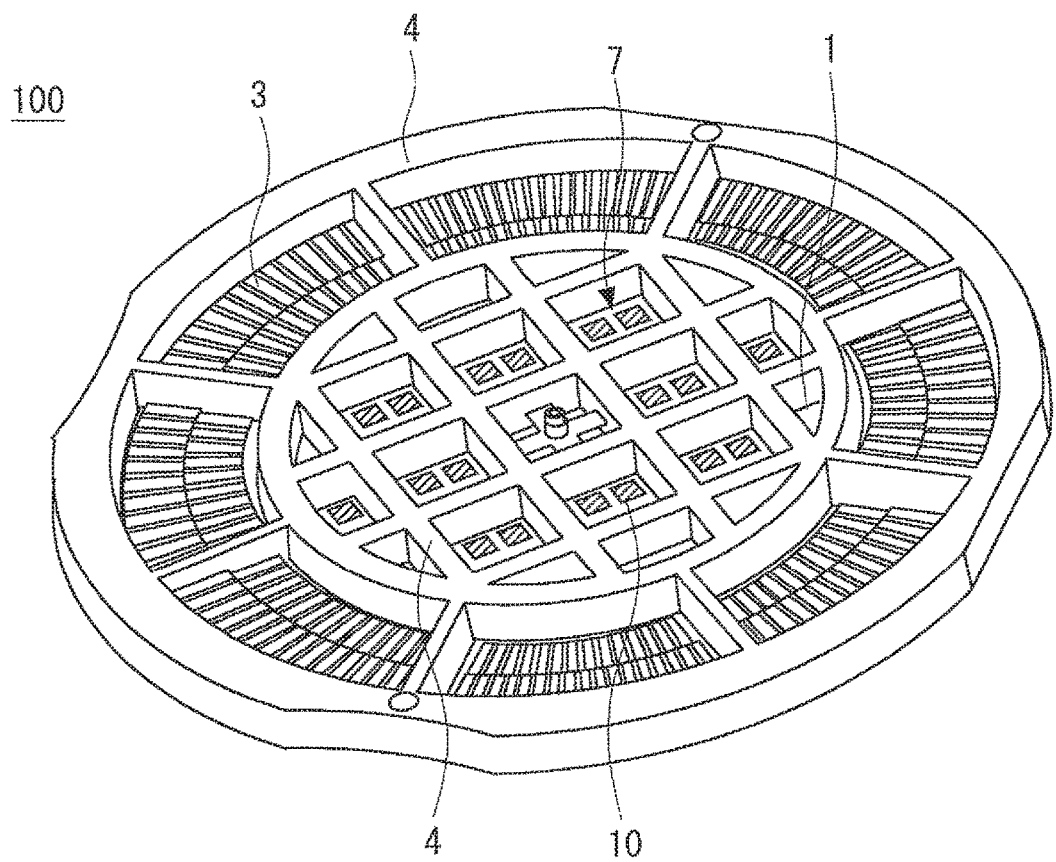
FIG. 1 is a perspective view of a probe card when it is seen from an upper surface side.

Hereinafter, an embodiment of the present invention will be explained with reference to the drawings. The following explanation illustrates a preferable embodiment of the present invention but the present invention shall not be limited to the following embodiment. In the following explanation, the same reference symbols indicate substantially the same contents.

An electrical connector and an inspection apparatus in which the electrical connector is used according to this embodiment are intended, for example, to achieve higher efficiency in a test of an object to be inspected such as an Integrated Circuit (IC) chip on a semiconductor wafer. For the purpose of improving efficiency in measurement, improvement in the present invention is made for compensating for a shortage of the number of power supply channels of a tester in simultaneous measurement of a large number of objects to be inspected. Specifically, the present invention relates to improvement of a circuit part to be mounted on the probe card including an interface connected to the tester. The present invention can be applied to various types of electrical connectors and testers including probe cards. At the same time, the present invention can be applied to all the inspection apparatuses in which the electrical connector and the tester are used. In the following description, a circuit configuration part to be mounted on a substrate, which serves as an interface for a tester, of a probe card will be mainly described. Further, a large number of IC chips (devices to be inspected) formed on a semiconductor wafer will be described as an example of the object to be inspected.

The inspection apparatus according to this embodiment includes a tester, a probe card including an interface connected to a test head of the tester, and a prober. The tester includes a plurality of power supply channels so that the plurality of IC chips can be inspected at the same time. These power supply channels are connected to the probe card via the test head.

The probe card has an upper surface provided with an interface (connector) connected to the test head of the tester and a lower surface including probes the number of which is larger than the number of power supply channels of the tester. Then the probe card is configured to branch each of the power supply channels into a plurality of channels on the probe card and to cause the power supply channels to be selectively connected to the plurality of IC chips to supply the test power supply, to thereby measure electrical characteristics (voltage, current, output signal characteristics and the like).

The prober includes a mechanism for supplying the device to be inspected, relatively aligning the device to be inspected with respect to the electrical connector, and contacting the probes of the probe card with pads of the device to be inspected.

In the apparatus that simultaneously measures the plurality of IC chips, the probe card may include a detection function that detects a failure in the IC chip under inspection and interrupts test power supply to the IC chip in which the failure has been detected. This eliminates the influence of a power supply failure and the like on other chips branched from the power supply channel the same as that from which the defective chip is branched. Furthermore, the inspection apparatus according to this embodiment can also be used for a burn-in inspection of a semiconductor device.

Figure 2:
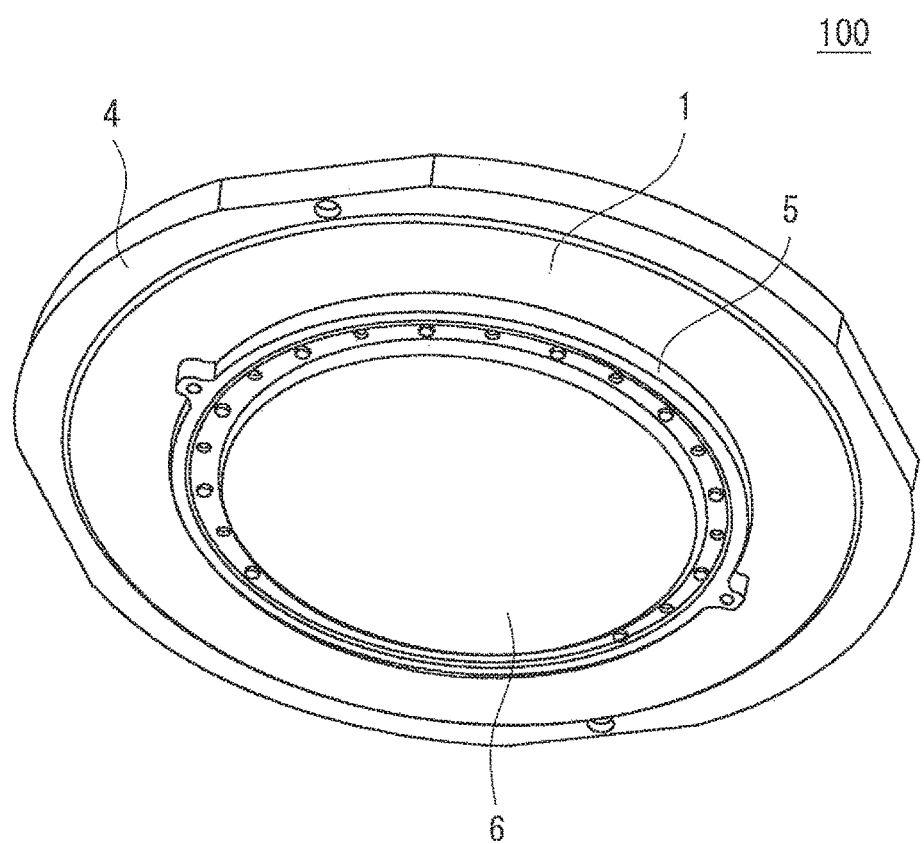
FIG. 2 is a perspective view of the probe card when it is seen from a lower surface side.

With reference to FIGS. 1 and 2, a configuration of the probe card will be described. FIG. 1 is a perspective view of a probe card 100 when it is seen from the upper surface side. FIG. 2 is a perspective view of the probe card 100 when it is seen from the lower surface side. While it is assumed that the probes (not shown in FIGS. 1 and 2) are provided on the lower side of the probe card 100 in the following description, the direction in which the probes are provided is a relative one and varies depending on the posture of the probe card 100.

The probe card 100 includes an interface substrate 1, a connector 3, a stiffener 4, an intermediate connector 5, and a probe substrate 6. The plurality of probes that contact the pads of the IC chip to be inspected (device to be inspected) are provided on the lower surface side of the probe substrate 6. The probes are projected to the lower side of the probe substrate 6 and contact terminals of the IC chip. Further, lines to be connected to the probes are formed in the probe substrate 6. The probe substrate 6 is formed in the shape of a disc corresponding to the semiconductor wafer. When the inspection is carried out, the probe substrate 6 is arranged on the semiconductor wafer. The probe substrate 6 includes, for example, a laminated body of a ceramic substrate and a thin-film multilayer substrate.

The intermediate connector 5 is provided on the probe substrate 6. The interface substrate 1 is provided on the intermediate connector 5. The stiffener 4 and a plurality of connectors 3 are provided on an upper surface of the interface substrate 1. The stiffener 4 serves as a rib to improve stiffness of the probe card 100. The stiffener 4 can suppress variations in the height of the probes. The stiffener 4 is partially arranged on the upper surface of the interface substrate 1.

The connector 3 is provided on the upper surface of the interface substrate 1. The connector 3 is provided, for example, in a part on the upper surface of the interface substrate 1 where the stiffener 4 is not provided. The plurality of connectors 3 are arranged along the outer periphery of the circular interface substrate 1. The plurality of connectors 3 of the interface substrate 1 are provided to be connected to the tester. The connector 3 of the probe card 100 is fitted, for example, with a connector of the tester that forms a pair with the connector 3 so that a line of the interface substrate 1 and a line of the tester are connected to each other. In this way, the interface substrate 1 serves as an interface for the tester. Therefore, a test power supply from the tester is supplied to the interface substrate 1.

The interface substrate 1 is a Printed Circuit Board (PCB) on which a plurality of wiring layers are provided. A multilayer substrate that connects layers by Interstitial Via Hole (IVH) can be used as the interface substrate 1. The interface substrate 1 is opposed to the intermediate connector 5.

The intermediate connector 5 is held between the probe substrate 6 and the interface substrate 1 in order to connect the probe substrate 6 and the interface substrate 1. That is, the interface substrate 1 and the probe substrate 6 are opposed to each other with the intermediate connector 5 interposed therebetween. The intermediate connector 5 includes, for example, connection pins such as POGO pins, a holder that holds the connection pins and the like. Internal lines of the interface substrate 1 and conducting paths of the probe substrate 6 are electrically connected to each other via the connection pins of the intermediate connector 5.

Further, a mounting region 7 is provided on the upper surface of the interface substrate 1. The mounting region 7 is arranged in a part in which the stiffener 4 is not connected to the interface substrate 1. In the mounting region 7, a plurality of semiconductor modules 10 are arranged. The semiconductor modules 10 are arranged at the center side of the interface substrate 1. That is, the mounting region 7 is provided above the probe substrate 6 and the connector 3 is mounted on the outer periphery side of the interface substrate 1 so that the connector 3 surrounds the mounting region 7. More preferably, the plurality of probes connected to one semiconductor module 10 are positioned on the probe substrate 6 which is located just below the semiconductor module so that the semiconductor module 10 and the probes can be connected in such a way that the distance between the semiconductor module 10 and the probes becomes the shortest. The semiconductor module 10 is mounted on the interface substrate 1 by a Ball Grid Array (BGA) or the like. That is, the semiconductor module 10 and the interface substrate 1 are electrically connected to each other via solder balls or the like.

Figure 3:
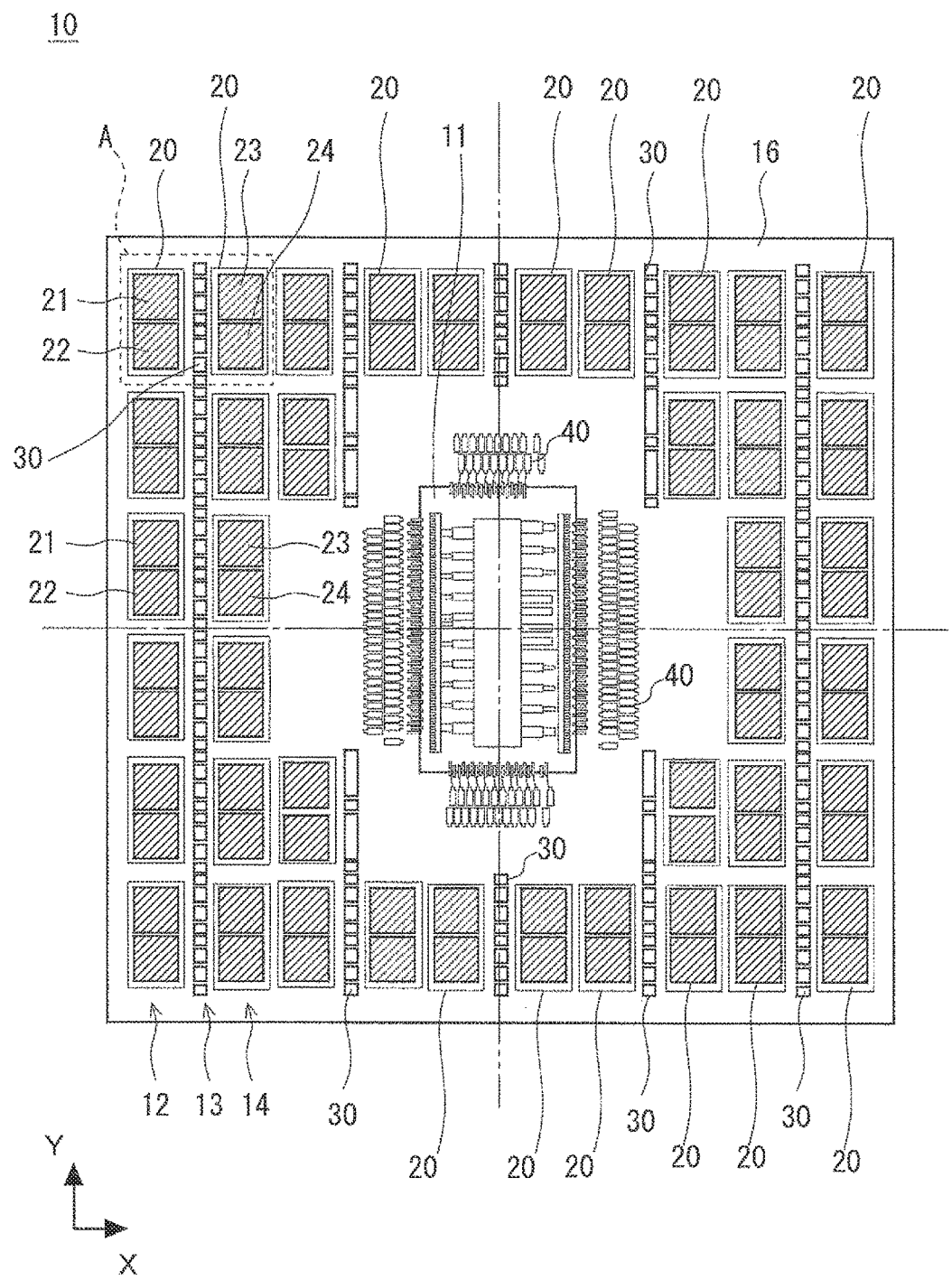
FIG. 3 is a top view showing a configuration of a semiconductor module used for the probe card.

Next, with reference to FIG. 3, the semiconductor module 10, which is one of the technical features of this embodiment, will be described. FIG. 3 is a plan view showing a configuration of one semiconductor module 10. FIG. 3 shows an XY rectangular coordinate system. The semiconductor module 10 includes a mounting substrate 16, a control IC 11, and semiconductor chips 20. Needless to say, the structure and the layout of the semiconductor module 10 shown in FIG. 3 are merely examples of the embodiment and the present invention is not limited to the structure and the layout shown in FIG. 3.

The mounting substrate 16 is a printed circuit board on which a plurality of lines are provided. The mounting substrate 16 has, for example, a rectangular shape with one side having a length of about 10 to 20 mm. The directions along the end sides of the mounting substrate 16 are the X and Y directions. The mounting substrate 16 includes pads 30 and pads 40. The control IC 11 and the semiconductor chips 20 are mounted on the mounting substrate 16. The control IC 11 is arranged at the center of the rectangular mounting substrate 16. The control IC 11 is mounted on the mounting substrate 16 by, for example, wire bonding. The control IC 11 is therefore connected to the pads 40.

Further, the plurality of semiconductor chips 20 are arranged around the control IC 11. In this example, the plurality of semiconductor chips 20 are arrayed on the outside of the control IC 11. The plurality of semiconductor chips 20 are arranged, for example, to surround the control IC 11. Further, the layout including one control IC 11 and the plurality of semiconductor chips 20 is symmetrical with respect to the center line along the Y direction (alternate long and two short dashes line in FIG. 3). The layout including one control IC 11 and the plurality of semiconductor chips 20 is symmetrical with respect to the center line along the X direction (alternate long and short dash line in FIG. 3). By forming the semiconductor module 10 symmetrically, it becomes easy to design the semiconductor module 10.

The plurality of semiconductor chips 20 are chips having the same structure. The semiconductor chips 20 are switches that switch the power supply channel. When each of the semiconductor chips 20, which is a switch, is turned on, the power supply channel of the tester is connected to the probe and when each of the semiconductor chips 20 is turned off, the power supply channel is isolated and separated from the probe. Each of the semiconductor chips 20 is turned on or off in accordance with a control signal from the control IC 11. The control IC 11 outputs the control signal that controls the semiconductor chips 20. The control signal from the control IC 11 is supplied to the semiconductor chips 20 via the line on the mounting substrate 16.

The semiconductor chips 20 each include two power MOS transistors that are adjacent to each other.

On the mounting substrate 16, the plurality of semiconductor chips 20 are aligned along the direction in which the two power MOS transistors that are mounted on the mounting substrate 16 are arranged. That is, in this embodiment, the plurality of semiconductor chips 20 are arranged along the Y direction in a direction in which the two power MOS transistors are arranged in the Y direction. In FIG. 3, there are ten columns of semiconductor chips 20 arranged along the Y direction. That is, on the mounting substrate 16, the semiconductor chips 20 are arranged in ten columns. In other words, ten chip columns are arranged on the mounting substrate 16. One column of the semiconductor chips 20 arranged on the left end of the mounting substrate 16 is referred to a first chip column 12 and the adjacent column thereof is referred to a second chip column 14.

The first chip column 12 includes six semiconductor chips 20. The second chip column 14 also includes six semiconductor chips 20. Since the semiconductor chips 20 cannot be provided in the position where the control IC 11 is provided, the number of semiconductor chips 20 included in one column in the position where the control IC 11 is provided is smaller than the number of semiconductor chips 20 included in the first chip column 12.

The plurality of pads 30 are arranged on the mounting substrate 16. The pads 30 are exposed on the surface of the mounting substrate 16. The pads 30 are connected to the lines provided in the mounting substrate 16. The pads 30 are arranged in the vicinity of the semiconductor chips 20 and are connected to the semiconductor chips 20. The semiconductor chips 20 are electrically connected to the respective pads 30 by, for example, wire bonding or the like. Therefore, the plurality of pads 30 are arranged on the mounting substrate 16 in accordance with the number of semiconductor chips 20.

On the mounting substrate 16, the plurality of pads 30 are arranged along the Y direction. In FIG. 3, there are five columns of pads 30 arranged along the Y direction. That is, on the mounting substrate 16, five columns of pads 30 are arranged. In other words, five pad columns are arranged on the mounting substrate 16. Chip columns are arranged on the respective sides of each pad column. In the XY plane, the semiconductor chips 20 of the first chip column 12 and the second chip column 14 of semiconductor chips 20 are arranged so as to be opposed to each other with the pads 30 interposed therebetween.

In the mounting substrate 16, the pad column on the left end is referred to as a pad column 13. The first chip column 12 is arranged on the left side of the pad column 13 and the second chip column 14 is arranged on the right side thereof. In other words, the pad column 13 is arranged between the first chip column 12 and the second chip column 14.

The two power MOS transistors provided in the semiconductor chip 20 included in the first chip column 12 are referred to a first transistor 21 and a second transistor 22 and two power MOS transistors provided in the semiconductor chip 20 included in the second chip column 14 are referred to a third transistor 23 and a fourth transistor 24.

Figure 4:
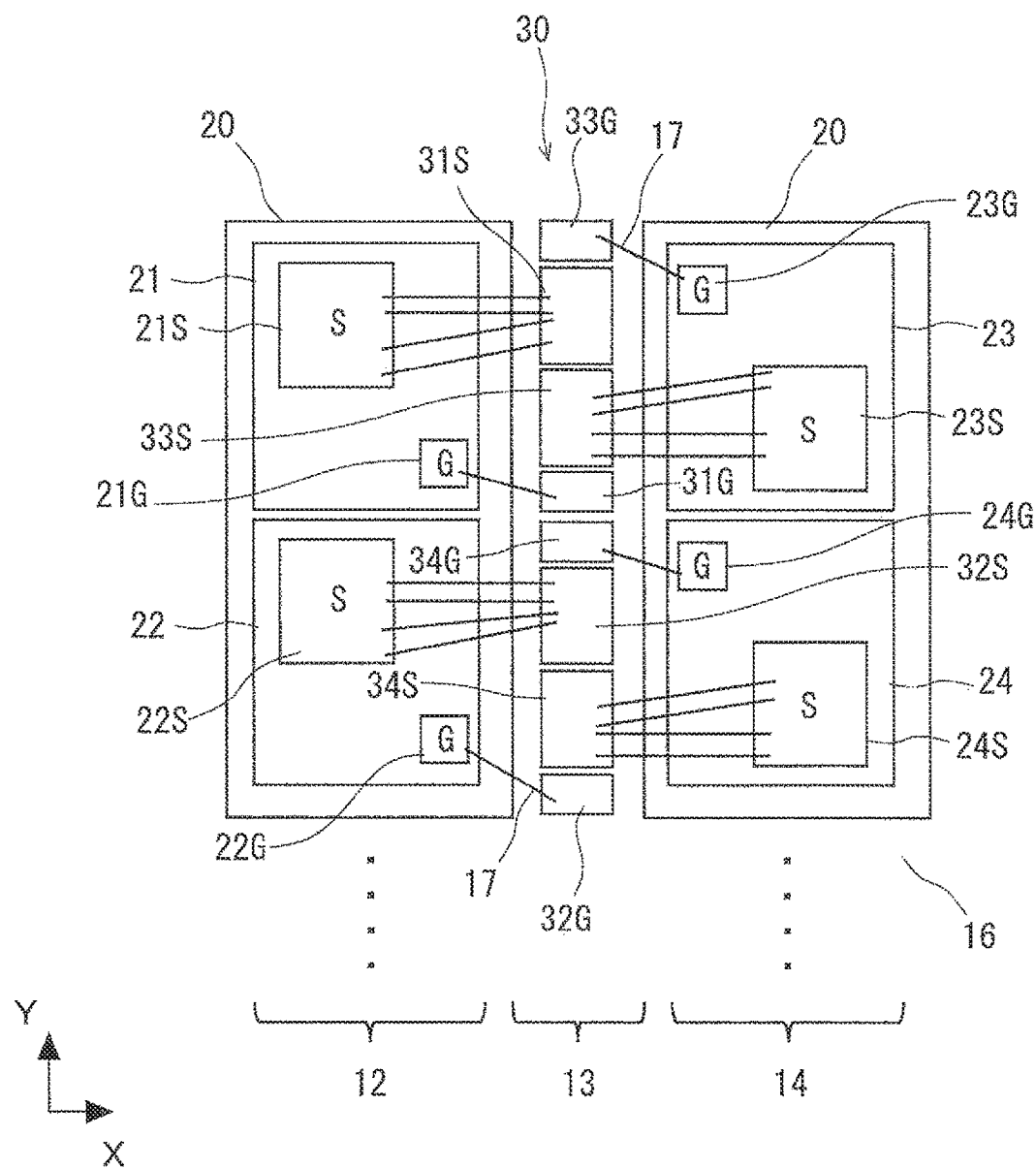
FIG. 4 is a schematic view showing an enlarged view of a part of the semiconductor module.

Next, with reference to FIG. 4, a connection configuration between the semiconductor chips 20 and the pads 30 will be described. FIG. 4 is a plan view in which a region A shown in FIG. 3 is enlarged. That is, FIG. 4 is an enlarged view schematically showing one semiconductor chip 20 of the first chip column 12, one semiconductor chip 20 of the second chip column 14, and the pads 30 provided between the two semiconductor chips 20. In the semiconductor chip 20, a plurality of structures shown in FIG. 4 are provided in accordance with the number of semiconductor chips 20.

As described above, the first chip column 12 is arranged on the left side (−X side) of the pad column 13 and the second chip column 14 is arranged on the right side (+X side) of the pad column 13. The semiconductor chip 20 in the first chip column 12 includes the first transistor 21 and the second transistor 22 and the semiconductor chip 20 in the second chip column 14 includes the third transistor 23 and the fourth transistor 24. The first transistor 21 and the second transistor 22 are arranged in a direction in which the first chip column 12 is aligned (Y direction) and the first transistor 21 is arranged on the upper side (+Y side) of the second transistor 22. The third transistor 23 and the fourth transistor 24 are arranged in a direction in which the second chip column 14 is aligned (Y direction) and the third transistor 23 is arranged on the upper side (+Y side) of the fourth transistor 24.

The first to fourth transistors 21-24 are each formed into a rectangular shape on a plan view. Each of the first to fourth transistors 21-24 is, for example, a square with one side having a length of about 1 mm. Each of the first to fourth transistors 21-24 is a vertical power Metal Oxide Semiconductor Field Effect Transistor (MOSFET) and may be, for example, a planar or trench power MOSFET. Therefore, in each of the first to fourth transistors 21-24, a drain electrode D is positioned on the rear surface side. Two transistors (the first transistor 21 and the second transistor 22 or the third transistor 23 and the fourth transistor 24) in one semiconductor chip 20 have a common drain electrode D on a side of a substrate. That is, the two transistors have a common semiconductor substrate in which the drain electrode D is formed. In other words, the drain electrodes D of the two transistors are continuously formed on the rear surface side (on the side of the mounting substrate 16) of the semiconductor chip 20.

Further, on the front side of each of the first to fourth transistors 21-24, a gate electrode G and a source electrode S are provided. In the first to fourth transistors 21-24, the layout of the gate electrodes G and source electrodes S is the same.

In each of the first to fourth transistors 21-24, the source electrode S is larger than the gate electrode G. Further, the source electrode S and the gate electrode G are each formed into a rectangular shape. In the first to fourth transistors 21-24, the source electrodes S have the same size. In the first to fourth transistors 21-24, the gate electrodes G have the same size.

In FIG. 4, in the first transistor 21, the gate electrode G is shown as a gate electrode 21G and the source electrode S is shown as a source electrode 21S. In a similar way, in the second transistor 22, the gate electrode G is shown as a gate electrode 22G and the source electrode S is shown as a source electrode 22S. In the third transistor 23, the gate electrode G is shown as a gate electrode 23G and the source electrode S is shown as a source electrode 23S. In the fourth transistor 24, the gate electrode G is shown as a gate electrode 24G and the source electrode G is shown as a source electrode 24S.

On the first transistor 21, the gate electrode 21G is arranged around the lower right corner and the source electrode 21S is arranged around the upper left corner. In a similar way, on the second transistor 22, the gate electrode 22G is arranged around the lower right corner and the source electrode 22S is arranged around the upper left corner. On the other hand, on the third transistor 23, the gate electrode 23G is arranged around the upper left corner and the source electrode 23S is arranged around the lower right corner. In a similar way, on the fourth transistor 24, the gate electrode 24G is arranged around the upper left corner and the source electrode 24S is arranged around the lower right corner.

The semiconductor chip 20 of the first chip column 12 and the semiconductor chip 20 of the second chip column 14 are arranged to be rotationally symmetrical with respect to each other. That is, when the semiconductor chip 20 of the first chip column 12 is rotated by 180° on the XY plane, the layout of the electrodes of the semiconductor chip 20 of the first chip column 12 after the rotation becomes equal to that of the electrodes of the semiconductor chip 20 of the second chip column 14. In any one of the first to fourth transistors 21-24, the gate electrode G is arranged to be closer to the pad column 13 than the source electrode S is. In other words, in the X direction, the source electrodes 21S, 22S, the gate electrodes 21G, 22G, the pads 30, the gate electrodes 23G, 24G, and the source electrodes 23S, 24S are arranged in this order from the −X side to the +X side.

In the pad column 13, the plurality of pads 30 are arranged along the Y direction. In this example, eight pads 30 are connected to the gate electrodes G and the source electrodes S of the first to fourth transistors 21-24.

The pads 30 included in the pad column 13 are, from top to bottom, a pad 33G, a pad 31S, a pad 33S, a pad 31G, a pad 34G, a pad 32S, a pad 34S, and a pad 32G. The pad 33G is connected to the gate electrode 23G, the pad 31S is connected to the source electrode 21S, the pad 33S is connected to the source electrode 23S, and the pad 31G is connected to the gate electrode 21G. The pad 34G is connected to the gate electrode 24G, the pad 32S is connected to the source electrode 22S, the pad 34S is connected to the source electrode 24S, and the pad 32G is connected to the gate electrode 22G.

The pad 31G, the pad 32G, the pad 33G, and the pad 34G are respectively smaller than the pad 31S, the pad 32S, the pad 33S, and the pad 34S. Lines 17 connect the source electrodes S and the gate electrodes G to the respective pads 30. That is, the lines 17 from the source electrodes S and the gate electrodes G to the respective pads 30 are formed by wire bonding. Accordingly, the pads 30 and the respective electrodes of the power MOS transistor are connected to each other.

As described above, the pads 30 are arranged according to the positions of the gate electrodes G and the source electrodes S. That is, the arrangement of the pads 30 is set according to the arrangement order of the gate electrodes G and the source electrodes S in the Y direction.

Further, in the Y direction, the pads 30 connected to the first transistor 21 and the pads 30 connected to the electrodes of the third transistor 23 are alternately arranged. The pad 31S is arranged, for example, between the pad 33G and the pad 33S. The pad 33S is arranged between the pad 31S and the pad 31G. In a similar way, the pads 30 connected to the third transistor 23 and the pads 30 connected to the second transistor 22 are also alternately arranged. In this way, two pads connected to the source electrode S and the gate electrode G of one transistor are arranged in such a way that they do not become continuous.

According to the structure stated above, the distance from the gate electrode G and the source electrode S to the corresponding pads 30 can be reduced. That is, the corresponding electrode and the pad 30 can be arranged so that they come close to each other. The lengths of the lines 17 that connect the pads 30 and the electrodes can be reduced and the wire bonding can be easily performed. It is possible to prevent, for example, the lines 17 that are adjacent to each other from crossing or contacting each other. It is therefore possible to definitely perform bonding in a simple way.

Further, the source electrode is connected on the path that connects the power supply channel of the tester and the probe of the probe card and the gate electrode is connected to the output of the control IC 11. Therefore, in general, the current that flows through the source electrode S is larger than the current that flows through the gate electrode G. Therefore, in FIG. 4, the number of lines 17 connected to the respective source electrodes S is made larger than the number of lines 17 connected to the respective gate electrodes G.

Figure 5:
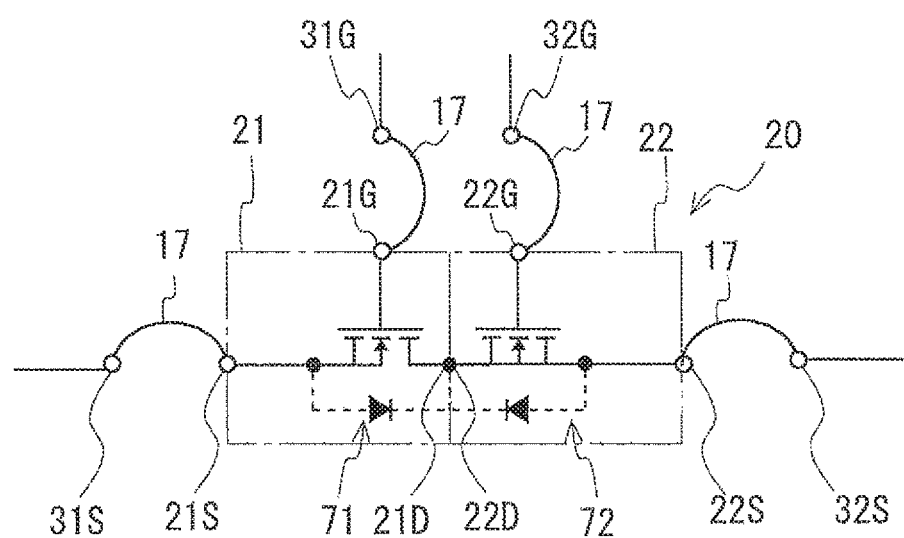
FIG. 5 is an equivalent circuit diagram of a part of the semiconductor module.

FIG. 5 is an equivalent circuit diagram of the power MOSFET, which is one semiconductor chip 20 of the first chip column 12 shown in FIG. 4. This semiconductor chip 20 is formed of the first transistor 21 and the second transistor 22, and the transistors 21 and 22 are cut out as a single substrate with the common drain. Accordingly, the drain electrode 21D of the first transistor 21 and the drain electrode 22D of the second transistor 22 are connected to each other. According to this structure, it is more possible to make connection at low resistance than it is in the case in which the transistors does not share the drain on the common substrate, that is, the case in which the drain electrode of the first transistor 21 and the drain electrode of the second transistor 22 are externally connected to each other after the first transistor 21 and the second transistor 22 are separately cut out from each other.

Further, in this embodiment, as shown in FIG. 5, the first transistor 21 and the second transistor 22 are arranged so that they become symmetrical with respect to the connection point of the drain electrodes 21D and 22D. Therefore, parasitic diodes 71 and 72 between the source and the drain of the transistors 21 and 22 are connected oppositely to each other. This allows a bidirectional current interruption, unlike the case in which the current of only one direction can be interrupted by a parasitic diode when the semiconductor chip is formed of one power MOSFET. Specifically, while a single-pole switch that is able to interrupt only the current from the drain 21D to the source 21S is formed when, for example, only the first transistor 21 is formed, a double-pole switch that is able to bidirectionally interrupt the current between the source 21S and the source 22S can be formed in this embodiment.

Further, in this embodiment, as described above, two power MOS transistors (e.g., the first transistor 21 and the second transistor 22) included in the semiconductor chip 20 have a common drain and the two power MOS transistors are formed in one chip. It is therefore possible to decrease the mounting area and to increase the mounting density. The reason therefor will be described as follows.

When a plurality of elements such as semiconductor chips or the like are mounted on the mounting substrate, the minimum mounting spacing is fixed depending on the performance of the mounting device (chip mounter), and in accordance therewith, an extra space needs to be provided around each of the chips. Accordingly, as the number of chips increases, the mounting area that includes, besides the chip area, extra space increases. Furthermore, when the two power MOS transistors are formed in different chips, a space for connecting the chips is also necessary. Further, if elements such as diodes or the like are additionally provided to protect the gate, a space for connecting them is also necessary.

In this embodiment, the two power MOS transistors are formed in one chip and have a common semiconductor substrate in which the drain electrode D is formed, whereby the mounting area can be reduced. It is therefore possible to increase the mounting density of the switches and to increase the number of switches to be mounted.

Further, one chip column is aligned in a direction in which two power MOS transistors included in each of the semiconductor chips 20 are arranged and the pad column 13 is arranged between the two adjacent chip columns 12 and 14. The electrodes of the two chip columns 12 and 14 are connected to the pads 30 included in one pad column 13. According to this structure, the pads 30 can be efficiently arranged and the space can be reduced. This causes an increase in the mounting density and an increase in the number of switches to be mounted.

Further, in this embodiment, the semiconductor module 10 that includes the plurality of semiconductor chips 20 is mounted on the interface substrate 1. It is therefore possible to easily perform mounting. That is, since the semiconductor module 10 including a large number of switches (40 switches in FIG. 3) is mounted on the interface substrate 1, the mounting process can be simplified compared to a configuration in which the respective relays are mounted on the interface substrate 1. Further, in this embodiment, on a probe substrate located just below each of the semiconductor modules 10, the connection terminal of the probe controlled by the semiconductor module 10 is located, whereby it is possible to connect a large number of semiconductor modules 10 and the probes so that the distance between the semiconductor modules 10 and the probes becomes short.

Figure 6:
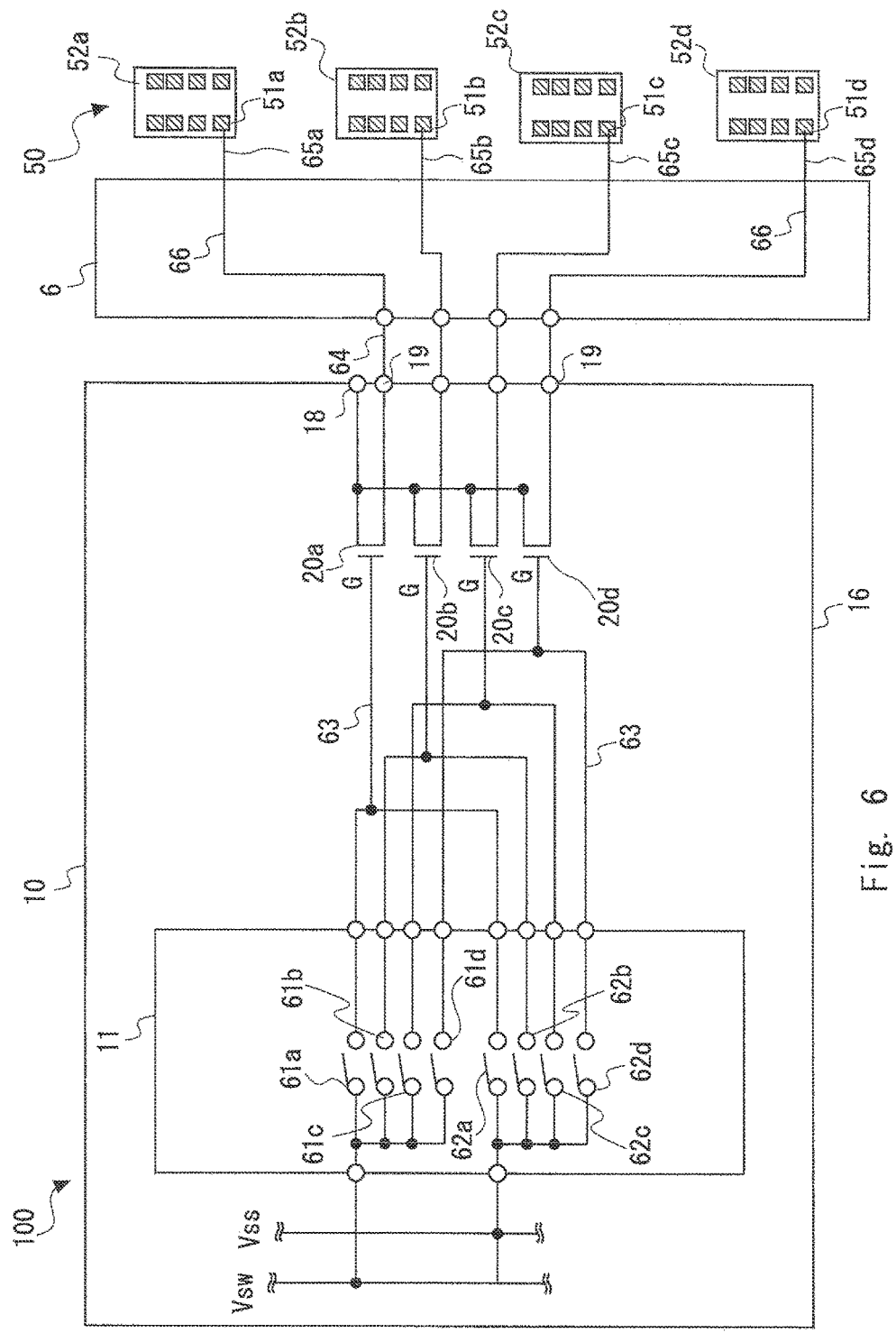
FIG. 6 is a circuit diagram showing a circuit for switching power supply channels.

Next, with reference to FIG. 6, a configuration of the switch circuit that uses the semiconductor chip 20 will be described. FIG. 6 is a circuit diagram showing a configuration that uses the semiconductor chip 20 as a switch. FIG. 6 shows a part of a circuit of the mounting substrate 16, more specifically, a circuit that uses four semiconductor chips 20. Further, in FIG. 6, some circuits and lines are not shown as appropriate. Further, FIG. 6 shows a circuit that switches the power supply channels using the four semiconductor chips 20 as switches. Therefore, in FIG. 6, four of the components are shown. In the semiconductor module 10, a plurality of structures shown in FIG. 6 are provided in accordance with the number of power supply channels.

As shown in FIGS. 1 and 2, the probe card 100 includes the semiconductor module 10 and the probe substrate 6. In FIG. 6, the interface substrate 1 and the intermediate connector 5 are not shown.

First, the connection structure of the probe substrate 6 and a semiconductor wafer 50, which is the target to be inspected, will be described. A plurality of probes 65*a* to 65*d* are provided in the probe substrate 6. Further, a plurality of devices to be inspected 52*a* to 52*d* are formed in the semiconductor wafer 50, which is the target to be inspected. Terminals 51*a* to 51*d* are respectively provided in the devices to be inspected 52*a* to 52*d*. The probes 65*a* to 65*d* are projected to the side of the devices to be inspected 52*a* to 52*d* from the probe substrate 6. The probes 65*a* to 65*d* are arranged on the probe substrate 6 so that they can simultaneously contact the terminals 51a to 51d, respectively. The probe 65a contacts, for example, the terminal 51a of the device to be inspected 52a. When there is no need to especially identify the devices to be inspected 52a to 52d, they are denoted by a device to be inspected 52. The probes 65a to 65d are also denoted by a probe 65.

The probe substrate 6 includes a plurality of lines 66. The plurality of lines 66 are respectively connected to the probes 65a to 65d. The lines 66 are connected to power output terminals 19 of the semiconductor module 10 via conducting paths 64. The conducting paths 64 are composed of lines, terminals and the like provided in the intermediate connector 5 and the interface substrate 1 (not shown in FIG. 6).

The circuits included in the semiconductor module 10 will be described. As described above, the semiconductor module 10 includes the mounting substrate 16, the control IC 11, and the semiconductor chips 20. Further, a first potential Vsw (H level: 16 V, for example) and a second potential Vss (L level: −3V, for example) are supplied to the mounting substrate 16 from the tester (not shown in FIG. 6) or the like via the connector 3 shown in FIG. 1. The mounting substrate 16 includes a power input terminal 18 and the plurality of power output terminals 19.

In this example, in order to explain channel switching by the four semiconductor chips 20, the four semiconductor chips 20 are shown as semiconductor chips 20a to 20d. That is, one of the semiconductor chips 20a to 20d is selectively turned on, whereby the test power supply is supplied to one of the devices to be inspected 52a to 52d.

Specifically, the power input terminal 18 is connected to the power supply channel via the connector 3. Then one power supply channel is branched into a plurality of channels and the plurality of channels are connected to the respective semiconductor chips 20a to 20d. The semiconductor chips 20a to 20d are connected to the respective power output terminals 19. The power output terminals 19 of the semiconductor module 10 are connected to the conducting paths 64 different from one another. When the devices to be inspected 65a to 65 are inspected, the semiconductor chips 20a to 20d are selectively turned on.

When the semiconductor chip 20a is turned on, for example, the test power supply is supplied to the terminal 51a of the device to be inspected 52a. The inspection of the device to be inspected 52a is then conducted. In this case, since the semiconductor chips 20b to 20d are turned off, the test power supply is not supplied to the terminals 51b to 51d of the devices to be inspected 52b to 52d.

The semiconductor chips 20a to 20d that are turned on are switched in turn. The test power supply is supplied to the devices to be inspected 52a to 52d in turn and it is thus possible to inspect the four devices to be inspected 52a to 52d.

As described above, the control IC 11 includes a control circuit that switches ON and OFF of the semiconductor chips 20a to 20d. Hereinafter, a circuit for switching ON and OFF of the semiconductor chips 20a to 20d will be described. The control IC 11 controls the semiconductor chips 20a to 20d based on a signal from the tester (not shown in FIG. 6) (hereinafter the signal from the tester used to control the semiconductor chip 20 is also called "an inspection signal"). That is, the control IC 11 selectively turns on the semiconductor chips 20a to 20d based on the inspection signal.

The control IC 11 includes control switches 61a to 61d and 62a to 62d to switch the semiconductor chips 20a to 20d. In the control IC 11, the first potential Vsw is branched off and then input to the control switches 61a to 61d. In a similar way, the second potential Vss is branched off and then input to the control switches 62a to 61d.

The output of each of the control switches 61a and 62a is connected to the gate electrode G of the semiconductor chip 20a. The output of each of the control switches 61b and 62b is connected to the gate electrode G of the semiconductor chip 20b. The output of each of the control switches 61c and 62c is connected to the gate electrode G of the semiconductor chip 20c. The output of each of the control switches 61d and 62d is connected to the gate electrode G of the semiconductor chip 20d. Lines 63 on the mounting substrate 16 connect the outputs of the control IC 11 and the gate electrodes G of the semiconductor chips 20a to 20d.

The control switch 61a and the control switch 62a form a pair and are selectively turned on. That is, one of the control switch 61a and the control switch 62a is turned on and the other one of them is turned off. When the semiconductor chip 20a is turned on, for example, the control switch 61a is turned on and the control switch 62a is turned off. In a similar way, the control switch 61b and the control switch 62b form a pair and are selectively turned on. The control switch 61c and the control switch 62c form a pair and are selectively turned on. The control switch 61d and the control switch 62d form a pair and are selectively turned on.

Further, the control switches 61a to 61d are selectively turned on. That is, when one of the control switches 61a to 61d is turned on, the three other switches are turned off. More specifically, when the semiconductor chip 20d is turned on, the control switch 61d is turned on and the control switches 61a, 61b, and 61c are turned off. In this case, the control switch 62d that forms a pair with the control switch 61d is turned off and the control switches 62a, 62b, and 62c that form a pair with the control switches 61a, 61b, and 61c are turned on. In other words, the control switches 62a to 62d are selectively turned off. That is, when one of the control switches 61a to 61d is turned off, the three other switches are turned on.

Among the control switches 61a to 61d, the semiconductor chip 20 corresponding to one control switch that has been turned on is supplied with the first potential Vsw. In this case, among the control switches 62a to 62d, the semiconductor chips 20 corresponding to the three control switches that have been turned off are supplied with the second potential Vss. When the control switch 61a is turned on and the control switch 62a is turned off, for example, the first potential Vsw is supplied to the gate electrode G of the semiconductor chip 20a. In this case, the control switches 61b, 61c, and 61d are turned off and the control switches 62b, 62c, and 62d are turned on. Therefore, the second potential Vss is supplied to the gate electrode G of each of the semiconductor chips 20b, 20c, and 20d. Accordingly, only the semiconductor chip 20a is turned on and the semiconductor chips 20b, 20c, and 20d are turned off. In this way, the semiconductor chips 20a to 20d can be selectively turned on. Accordingly, as described above, the test power supply is supplied to the device to be inspected 52a.

The inspection apparatus in this embodiment branches each power supply channel into a plurality of channels on the probe card 100, causes the plurality of channels to be connected to the plurality of devices to be inspected 52, and supplies a test power supply. Accordingly, by controlling ON and OFF of the semiconductor chips 20a to 20d, the number of devices to be inspected 52 can be increased. When the number of power supply channels of the tester is 256, for example, by branching the power supply channel into four channels, 1024 devices can be inspected at the same time.

Further, in the apparatus for simultaneously measuring the plurality of devices to be inspected 52, a failure in the device 52 which is being inspected is detected and the power supply for inspection (test power supply) to the device to be inspected 52 in which the failure has been detected is interrupted. A circuit on the probe card of this inspection apparatus incorporates an element that interrupts the test power supply. When there is a defective chip (device to be inspected 52), the semiconductor chip 20 connected to the defective chip is constantly shut off so that the test power supply applied to the defective chip is interrupted. This eliminates the influence of a power supply failure and the like on other devices to be inspected 52 branched from the power supply channel the same as that from which the defective chip is branched. It is therefore possible to perform an accurate inspection.

The control IC 11 may store, for example, a defective device to be inspected. Then the control IC 11 may store the defective chip and interrupt the power supply to the defective chip. Otherwise, the tester may store information for identifying the defective device to be inspected and the control IC 11 may stop, based on this information, the power supply to the defective chip.

Figure 7:
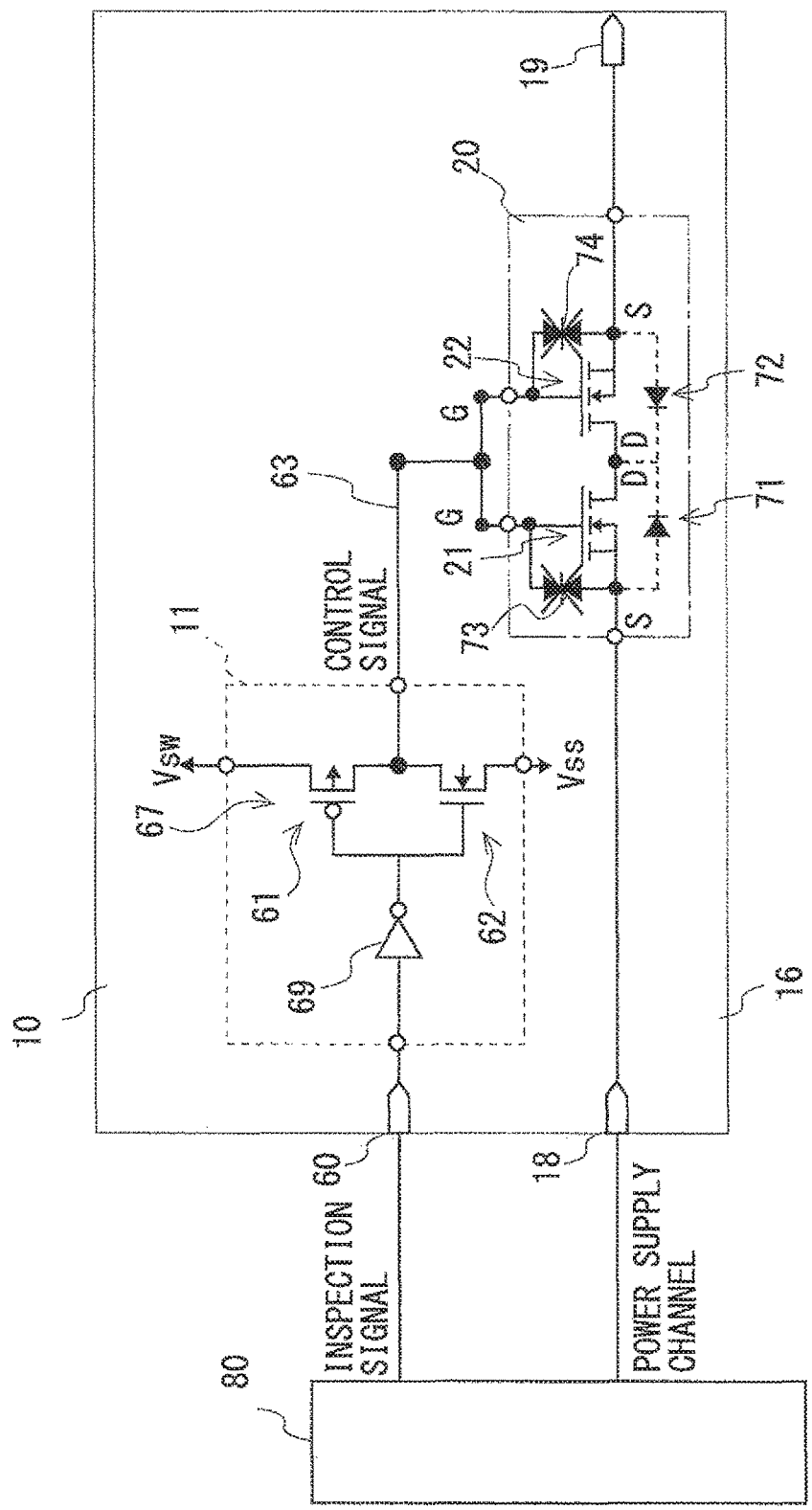
FIG. 7 is a diagram showing a switch circuit using a semiconductor chip.

Next, with reference to FIG. 7, a configuration of the transistors of the semiconductor chip 20 and the control circuit will be described in further detail. FIG. 7 is a circuit diagram showing a configuration of the transistors of one semiconductor chip 20 and the control switches 61 and 62 provided corresponding to the semiconductor chip 20. That is, FIG. 7 shows some of the configurations shown in FIG. 6. Specifically, FIG. 7 shows a configuration of one pair of the control switches 61 and 62 shown in FIG. 6 and one configuration of the semiconductor chip 20. Since the circuit configurations of the control switches 61*a* to 61*d* and 62*a* to 62*d* and the semiconductor chips 20*a* to 20*d* are similar to those shown in FIG. 7, the descriptions thereof will be omitted. That is, the configuration shown in FIG. 7 is provided for each of the semiconductor chips 20.

Figure 8:
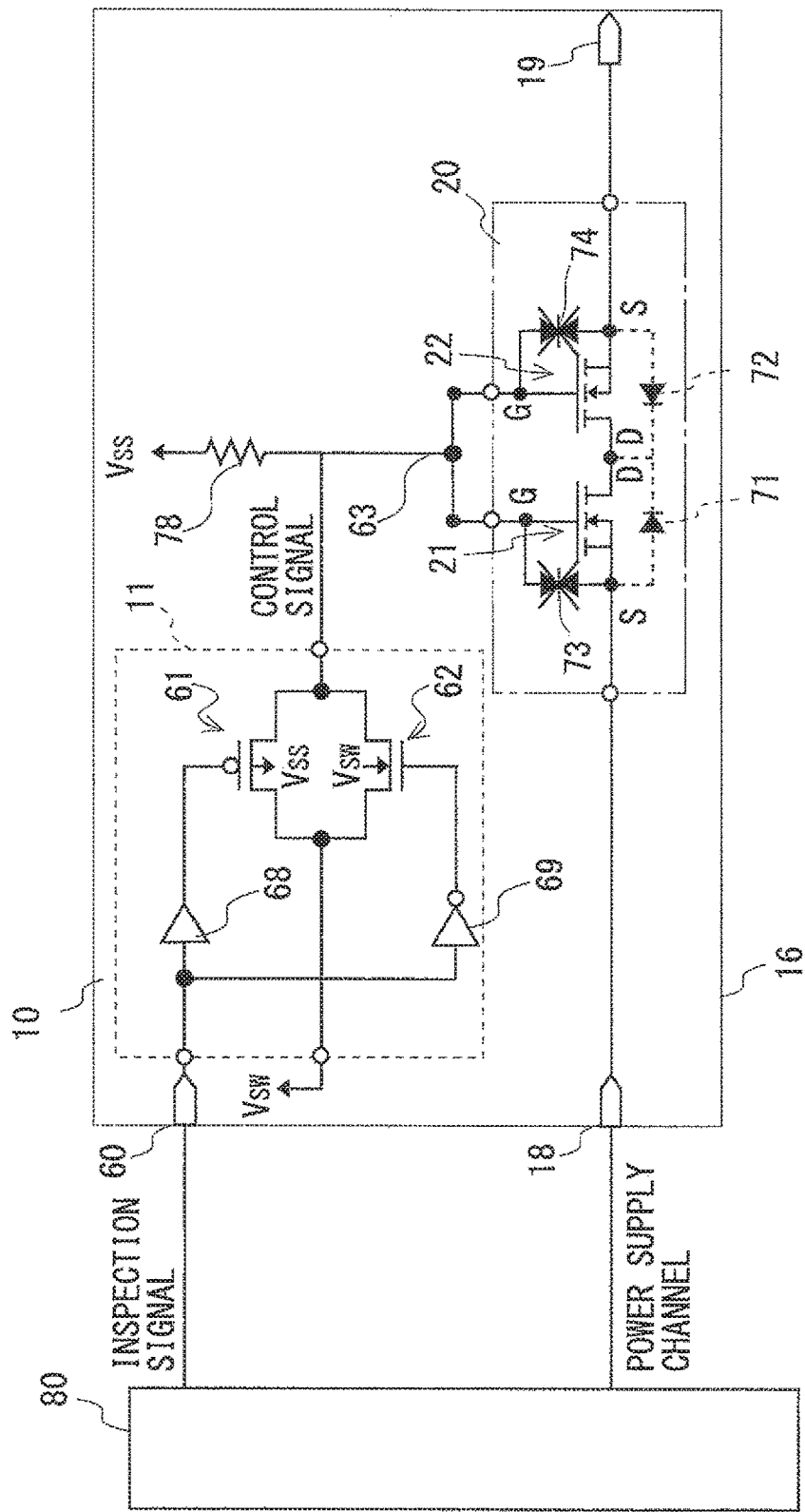
FIG. 8 is a diagram showing a switch circuit according to a first modified example.
Figure 9:
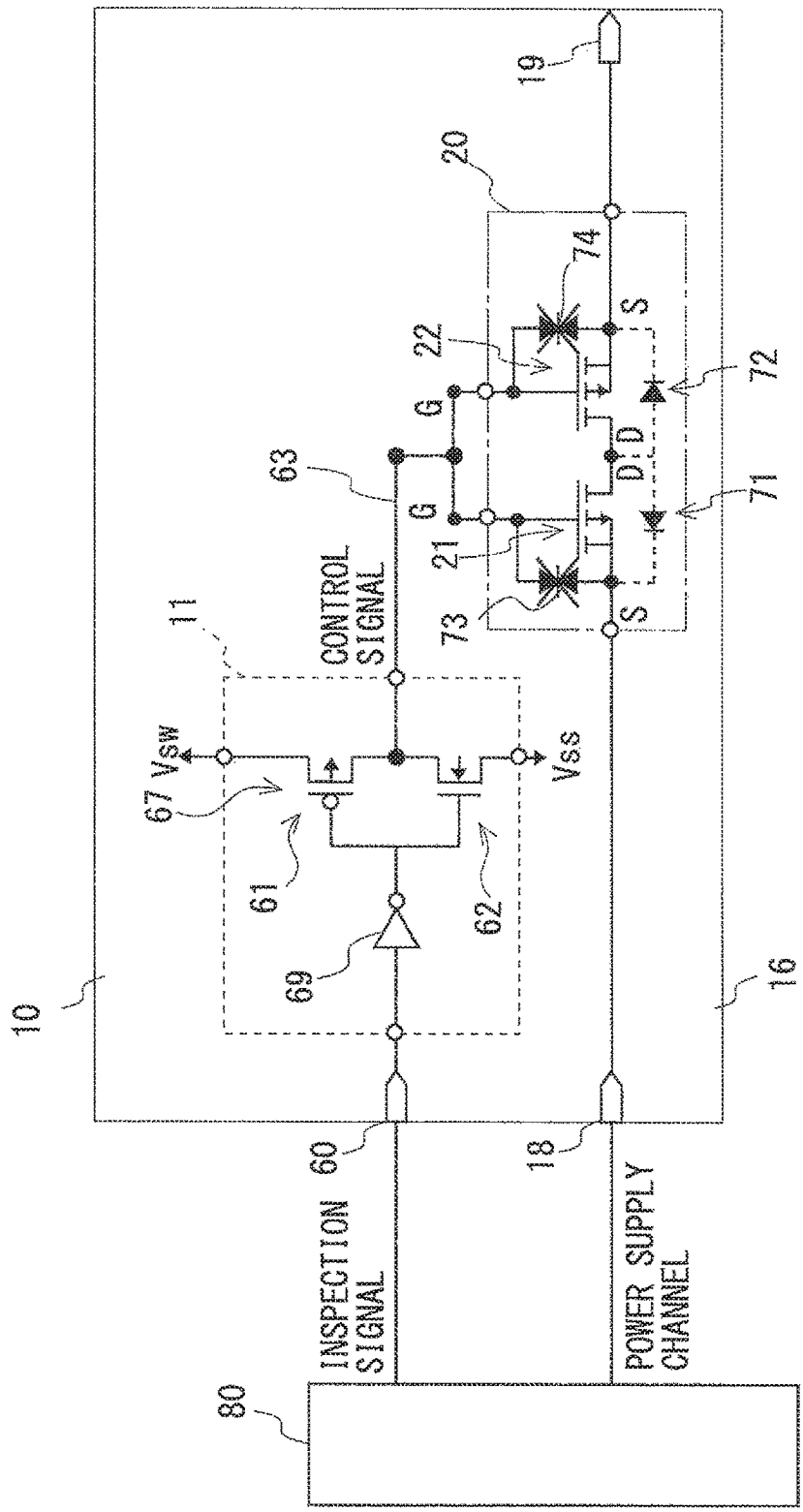
FIG. 9 is a diagram showing a switch circuit according to a second modified example.
Figure 10:
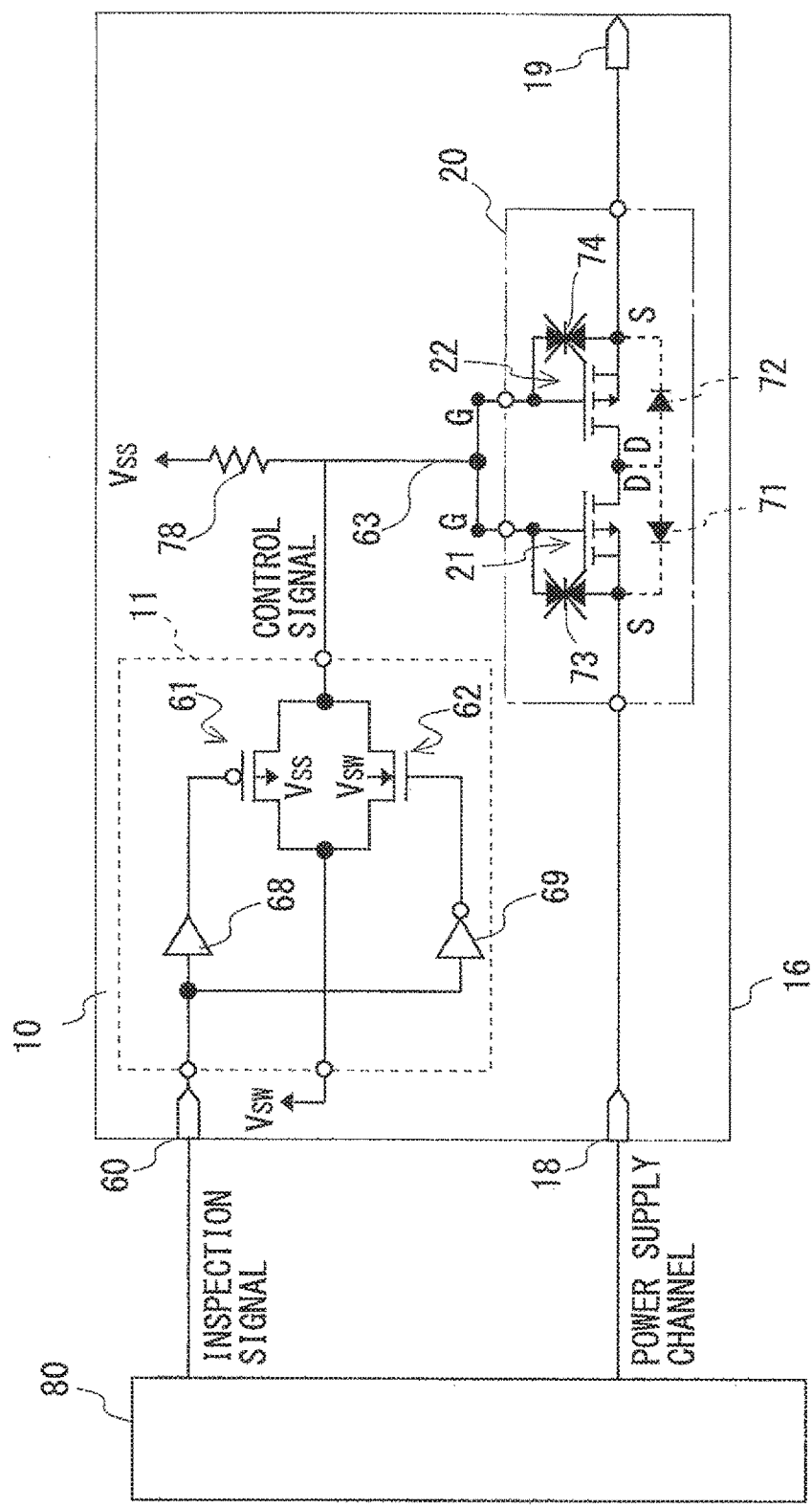
FIG. 10 is a diagram showing a switch circuit according to a third modified example.

Note that a line that connects the gate and the drain and gate protection circuits 73 and 74 provided on the line are shown in FIG. 7 only for the purpose of explanation and they are not actually provided in the semiconductor module 10 (the same is also applicable to FIGS. 8, 9, and 10).

A tester 80 supplies the test power supply from the power supply channel to the power input terminal 18 of the semiconductor module 10. The power input terminal 18 and the power output terminal 19 are connected to each other via the semiconductor chip 20. Further, the tester 80 supplies an inspection signal to a control input terminal 60 of the semiconductor module 10. The inspection signal, which is a digital signal, is supplied to the control IC 11. Specifically, the inspection signal is supplied to the control switches 61 and 62 via an inverting amplifier 69.

The control switch 61 is a pMOS, the control switch 62 is an nMOS, and the control switch 61 and the control switch 62 integrally form a CMOS 67. That is, the gate of the control switch 61 and the gate of the control switch 62 are connected to each other and then connected to the inverting amplifier 69 and the drain of the control switch 61 and the drain of the control switch 62 are connected to each other and then connected to the line 63. The source of the control switch 61 is connected to the first potential Vsw and the source of the control switch 62 is connected to the second potential Vss. The inspection signal from the inverting amplifier 69 is inverted and the inverted signal is supplied to the gate of the control switch 61 and that of the control switch 62. Accordingly, one of the control switch 61 and the control switch 62 is turned on. The output of each of the control switches 61 and 62 is connected to the gate electrode G of the first transistor 21 and that of the second transistor 22 via the line 63.

As stated above, the control IC 11 outputs the control signal in accordance with ON/OFF of the control switches 61 and 62 to the semiconductor chip 20. The control signal is supplied to the gate electrode G of the first transistor 21 and that of the second transistor 22 via the line 63. The line 63 is provided on the mounting substrate 16. That is, the line 63 is branched on the mounting substrate 16 and is connected to the gate electrode G of the first transistor 21 and the gate electrode G of the second transistor 22.

Accordingly, when the control switch 61 is turned on, the first potential Vsw is supplied to the gate electrode G of the first transistor 21 and that of the second transistor 22. On the other hand, when the control switch 62 is turned on, the second potential Vss is supplied to the gate electrode G of the first transistor 21 and that of the second transistor 22.

The semiconductor chip 20 includes, as stated above, the first transistor 21 and the second transistor 22. The first transistor 21 and the second transistor 22 are connected in series between the power input terminal 18 and the power output terminal 19. The first transistor 21 and the second transistor 22 are n-channel power MOS transistors and share the common drain electrode D on the side of the substrate. That is, the drain electrode D of the first transistor 21 and the drain electrode D of the second transistor 22 are electrically conducted to each other. The source electrode S of the first transistor 21 is connected to the side of the tester 80, that is, to the power input terminal 18. On the other hand, the source electrode S of the second transistor 22 is connected to the side of probe, that is, to the power output terminal 19.

Accordingly, when the first potential Vsw is supplied to the gate electrode G of the first transistor 21 and that of the second transistor 22, the first transistor 21 and the second transistor 22, which are both switches, are turned on. Then the power input terminal 18 and the power output terminal 19 are connected to each other. That is, the probe and the tester 80 are connected to each other.

On the other hand, when the second potential Vss is supplied to the gate electrode G of the first transistor 21 and that of the second transistor 22, the first transistor 21 and the second transistor 22, which are switches, are turned off. Then the power input terminal 18 and the power output terminal 19 are disconnected from each other. That is, the probe is separated from the tester 80 and the power supply to the probe can be interrupted. In this way, the semiconductor chip 20 controls the connection between the probe and the power supply channel of the tester in accordance with the control signal.

As described above, by arranging the drain electrode of the first transistor 21 and the drain electrode of the second transistor 22 so that they face each other and connecting them in series, the leak current between the power input terminal 18 and the power output terminal 19 can be reduced. The parasitic diodes 71 and 72 are each provided, for example, between the source electrode S and the drain electrode D. Therefore, when only one transistor is provided, a leak current flows between the power input terminal 18 and the power output terminal 19 due to the presence of the parasitic diode.

On the other hand, in this embodiment, by connecting the drain electrodes of the first transistor 21 and the second transistor 22 that are connected in series, the forward direction of the parasitic diode 71 becomes opposite to the forward direction of the parasitic diode 72. The direction from the power input terminal 18 to the power output terminal 19 is, for example, the forward direction for the parasitic diode 71, whereas the direction from the power input terminal 18 to the power output terminal 19 is the reverse direction for the parasitic diode 72. It is therefore possible to bidirectionally interrupt the current. This enables the bidirectional switching and a reduction in the leak current.

Furthermore, the power MOS transistor typically needs the gate protection circuits 73 and 74, each provided between the gate and the source, in order to protect the gate oxide film and a protective diode such as a schottky diode is provided, for example, in an element of the power MOS transistor or between gate and source of the external circuit. These gate protection circuits 73 and 74 may cause a leak current between the gate and the source.

On the other hand, in the circuit configuration according to this embodiment, the line 63 between the semiconductor chip 20 and the control IC 11 does not come outside of the semiconductor module 10. That is, the line 63 from the gate electrodes G is connected only to the output of the control IC 11. Therefore, the output stage of the control IC 11 can be used as a gate protection circuit.

In this configuration, there is no need to form the gate protection circuits 73 and 74 to protect the gate oxide film between the gate electrode G and the source electrode S. Since the gate protection circuits 73 and 74 that connect the gate and the source are not provided in the inside and the outside of the semiconductor chip 20, the leak current can be reduced. It is therefore possible to prevent degradation in the measurement accuracy when the current is measured by the tester. Accordingly, by mounting the semiconductor module 10 on the probe card 100, an accurate inspection can be performed.

Further, the paths of the power supply channels and the control circuit that controls the open/close state of the power supply channels can be separated from each other with the power MOS transistors 21 and 22 interposed therebetween, whereby the leak current can be reduced and the measurement accuracy can be improved. Further, by controlling the open/close state of the power MOS transistors 21 and 22 by the CMOS 67, power consumption and the heat generation amount can be reduced.

In the present invention, in two transistors included in the semiconductor chip 20, the electrodes that control the conduction are referred to control electrodes (gate electrode G in this embodiment), electrodes, which are of the same type and are connected to each other, among electrodes arranged at respective ends of the conducting paths controlled by the control electrodes are referred to first electrodes (drain electrode D in this embodiment), and the other electrodes, which are of the same type on the input/output sides, among the electrodes arranged at the respective ends of the conducting paths controlled by the control electrodes are referred to second electrodes (source electrode S in this embodiment).

FIRST MODIFIED EXAMPLE

FIG. 8 is a circuit diagram showing a first modified example of the circuit configuration of the control switches 61 and 62 of the control IC 11 and the semiconductor chip 20. While the line 63 from the control switches 61 and 62 to the semiconductor chip 20 does not come outside of the semiconductor module 10 in FIG. 7, the line 63 is connected to the outside via a resistor 78 in FIG. 8. That is, the second potential Vss from the outside is supplied to the gate electrodes G via the resistor 78.

In FIG. 8, the circuit configurations of the control switches 61 and 62 are different from those shown in FIG. 7. In the description of the modified examples, the descriptions of the parts the same as those in FIG. 7 will be omitted. For example, since the configurations of the first transistor 21 and the second transistor 22 in the semiconductor chip 20 are the same as those shown in FIG. 7, the description thereof will be omitted.

The control switch 61 and the control switch 62 are connected in parallel between the first potential Vsw and the second potential Vss. The control switch 61 is a pMOS and the control switch 62 is an nMOS. The inspection signal is supplied to the gate of the control switch 61 via an amplifier 68. The inspection signal is supplied to the gate of the control switch 62 via the inverting amplifier 69. Therefore, in FIG. 8, the control switch 61 and the control switch 62 are concurrently turned on/off.

When the control switch 61 and the control switch 62 are concurrently turned on, the first potential Vsw is supplied to the gate electrode G of the first transistor 21 and that of the second transistor 22 via the line 63. When the control switch 61 and the control switch 62 are concurrently turned off, the second potential Vss is supplied to the gate electrode G of the first transistor 21 and that of the second transistor 22 via the resistor 78 and the line 63.

According to the above configuration, effects similar to those in FIG. 7 can be obtained. That is, since the parasitic diodes 71 and 72 are connected in series in opposite directions, the power supply can be bidirectionally interrupted. Further, since the two power MOS transistors 21 and 22 are included in the semiconductor chip 20, the mounting area can be reduced. Further, the gate protection circuits 73 and 74 between the gate electrodes G and the source electrodes S of the power MOS transistors 21 and 22 can be removed. It is therefore possible to reduce the leak current between the gate and the source, whereby it is possible to prevent degradation of the measurement accuracy when the current is measured by the tester. Further, the paths of the power supply channels and the control circuit that controls the open/close state thereof can be separated from each other with the power MOS transistors 21 and 22 interposed therebetween, the leak current can be reduced and the measurement accuracy can be improved. Further, by controlling the open/close state of the power MOS transistors 21 and 22 by the MOS transistors 61 and 62, power consumption and the heat generation amount can be reduced.

SECOND MODIFIED EXAMPLE

While the N-channel power MOSFET has been used as the first transistor 21 and the second transistor 22 in FIG. 7, a P-channel power MOSFET can be used as shown in FIG. 9. According to the above configuration, the effects similar to those in FIG. 7 can be obtained.

THIRD MODIFIED EXAMPLE

While the N-channel power MOSFET has been used as the first transistor 21 and the second transistor 22 in FIG. 8, a P-channel power MOSFET may be used as shown in FIG. 10. According to the above configuration, the effects similar to those in FIG. 8 can be obtained.

In the semiconductor module 10, the first embodiment and the first to third modified examples may be combined with each other. The semiconductor module 10 may be equipped with, for example, a combination of the semiconductor chip 20 of the P-channel MOSFET and the semiconductor chip 20 of the N-channel MOSFET.

Other Embodiments

Since the circuit configuration of the semiconductor chip 20 including the third transistor 23 and the fourth transistor 24 is the same as the circuit configuration of the semiconductor chip 20 including the first transistor 21 and the second transistor 22, the description thereof will be omitted. While the first transistor 21 and the second transistor 22 have a common drain potential in the aforementioned embodiment, they may have a common source potential. That is, the first transistor 21 and the second transistor 22 may be configured in such a way that the source electrodes S of the first transistor 21 and the second transistor 22 connected in series face each other. Further, while the planar power MOS transistor has been used as the vertical power MOS transistor in the aforementioned embodiment, another vertical power MOS transistor may be used. A trench power MOS transistor, a super-junction MOS transistor, or a high-speed body-diode power MOS transistor may be used, for example. Alternatively, a lateral power MOS transistor may be used.

While the power MOS transistor has been provided as a power device of the semiconductor chip 20, the transistor is not particularly limited as long as a common substrate can be formed. An Insulated Gate Bipolar Transistor (IGBT) or a bipolar transistor may be used, for example. Accordingly, the first transistor 21 and the second transistor 22 have a common first electrode on the substrate side of the semiconductor chip 20. The second electrode of the first transistor 21 is connected to the side of the tester 80 and the second electrode of the second transistor 22 is connected to the probe side. The control electrodes of the first and second transistors control the connection between the power supply channel of the tester 80 and the probe 65 in accordance with the control signal from the control IC 11. When the IGBT or the bipolar transistor is used, the collector electrode, which is a first electrode, may be commonly used. Then the emitter electrode, which is the second electrode, may be connected to the tester side and the probe side. Alternatively, the rear surface of the semiconductor chip 20 may be plated with Au or the like to reduce the ON resistance of the transistor.

Further, in the semiconductor module 10, a switch other than the semiconductor chip 20 including the two power MOS transistors may be provided. That is, it is sufficient that the semiconductor module 10 include one or more semiconductor chips 20.

Further, by using the semiconductor module 10, the size of the switch circuit that switches the power supply channels can be reduced. Therefore, the connection terminal of the semiconductor module 10 provided on the tester side of the probe card 100 and the connection terminal of the probe provided on the side of the wafer 50 of the probe card 100 may be vertically connected. That is, the connection terminal of the probe is arranged just below the semiconductor module. While the space for the switch circuit is limited in the probe card, the space just above the probes can be used as the space for the semiconductor module 10. It is therefore possible to efficiently use the space of the probe card 100. Further, the lengths of the conducting paths between the semiconductor module 10 and the probes can be reduced.

While the example in which the semiconductor module 10 is used for the probe card 100 in the semiconductor wafer inspection has been described in the aforementioned description, the semiconductor module 10 is not limited to being applied to the probe card. The semiconductor module 10 may be used, for example, for an electrical connector of the inspection apparatus that performs a package test (final test) of the semiconductor package. The semiconductor module 10 may be used for an electrical connector (e.g., a board such as a DUT board or a performance board) that is interposed between the tester head and the IC socket. Accordingly, in the present invention, the semiconductor module 10 can be used for the electrical connector between the element that contacts the device to be inspected and the tester. Furthermore, the semiconductor module 10 can be used for the tester 80.

Further, the semiconductor module 10 may be used for applications other than the semiconductor inspection apparatus. The semiconductor module 10 may be used, for example, for an inspection apparatus (a tester, a prober) used for an inspection process when a liquid crystal display is manufactured (an array inspection process, a cell inspection process, a module inspection process). The semiconductor module 10 can be used, for example, for a control switch that is provided between the probe unit that contacts the device to be inspected and the tester.

While the embodiment of the present invention has been described above, the present invention includes appropriate modifications without impairing the objects and the advantages of the present invention and are not limited by the aforementioned embodiment.

This application is based upon and claims the benefit of priority from Japanese Patent Application No. 2014-146427, filed on Jul. 17, 2014, the disclosure of which is incorporated herein in its entirety by reference.

REFERENCE SIGNS LIST

1 INTERFACE SUBSTRATE
3 CONNECTOR
4 STIFFENER
5 INTERMEDIATE CONNECTOR
6 PROBE SUBSTRATE
10 SEMICONDUCTOR MODULE
11 CONTROL IC
12 FIRST CHIP COLUMN
13 PAD COLUMN
14 SECOND CHIP COLUMN
16 MOUNTING SUBSTRATE
17 LINE
18 POWER INPUT TERMINAL
19 POWER OUTPUT TERMINAL
20 SEMICONDUCTOR CHIP
21 FIRST TRANSISTOR
22 SECOND TRANSISTOR
23 THIRD TRANSISTOR
24 FOURTH TRANSISTOR
30 PAD
31 PAD
50 SEMICONDUCTOR WAFER
51 TERMINAL
52 DEVICE TO BE INSPECTED
61 CONTROL SWITCH
62 CONTROL SWITCH
G GATE ELECTRODE
S SOURCE ELECTRODE
D DRAIN ELECTRODE
100 PROBE CARD

The invention claimed is:

1. A semiconductor module used for an electrical connector that is electrically interposed between an electrode of a device to be inspected and a power supply channel of a tester, the semiconductor module comprising:
a mounting substrate that includes a line, a control input terminal and a power input terminal;
a control IC mounted on the mounting substrate; and
a plurality of semiconductor chips mounted on the mounting substrate, wherein:
each of the plurality of semiconductor chips comprises first and second transistors that are connected in series between a side of the electrode of the device to be inspected and a side of the power supply channel of the tester,
the first transistor and the second transistor have a common semiconductor substrate of the semiconductor chip,
a first electrode of the first transistor and a first electrode of the second transistor are a common electrode formed on a rear surface side of the semiconductor chip,
a second electrode of the first transistor is connected to the side of the power supply channel of the tester through the power input terminal and a second electrode of the second transistor is connected to the side of the electrode of the device to be inspected, and
a control signal from the control IC is supplied to a control electrode of the first transistor and that of the second transistor via the line so that the connection between the side of the power supply channel of the tester and the side of the electrode of the device to be inspected is controlled,
wherein the first and second transistors are both n-channel power MOS transistors or both p-channel power MOS transistors,
the first electrode is a drain electrode, the second electrode is a source electrode, and the control electrode is a gate electrode,
wherein parasitic diodes between source and drain of the first and second transistors are connected oppositely to each other, and
wherein an inspection signal is input to the control IC from the tester through the control input terminal.

2. The semiconductor module according to claim 1, wherein: the control IC comprises a CMOS, and
a control signal from the control IC corresponds to an output from the CMOS.

3. The semiconductor module according to claim 1, wherein:
a chip column in which two or more semiconductor chips are arranged along a first direction is provided on the mounting substrate, and
the first and second transistors are arranged along the first direction in each of the two or more semiconductor chips included in the chip column.

4. The semiconductor module according to claim 3, wherein:
the second electrode of the semiconductor chip and a pad connected to the control electrode are provided on the mounting substrate,
a pad column including a plurality of pads arranged along the first direction is provided on the mounting substrate,
the pad column is arranged between two chip columns, and the second electrode and the control electrode of the semiconductor chip included in the two chip columns are connected to the pads included in the pad column.

5. The semiconductor module according to claim 1, wherein a gate protection circuit is not provided between the control electrode and the second electrode of the semiconductor chip.

6. The semiconductor module according to claim 5, wherein a line from an output terminal of the control IC to the control electrode of the semiconductor chip is not connected to the first electrode and the second electrode of the semiconductor chip.

7. An electrical connector comprising:
the semiconductor module according to claim 1;
an interface substrate on which the semiconductor module is mounted; and
a probe substrate comprising a plurality of probes connected to the second electrode of the second transistor.

8. The electrical connector according to claim 7, wherein a connection terminal of a probe connected to the semiconductor module is located just below the semiconductor module.

9. An inspection apparatus comprising:
the electrical connector according to claim 7; and
a tester that supplies a test power supply to the electrical connector from a power supply channel.

10. A semiconductor module comprising:
a mounting substrate comprising a line, a control input terminal, a power input terminal, and a plurality of power output terminals;
a control IC mounted on the mounting substrate; and
a plurality of semiconductor chips mounted on the mounting substrate, wherein:
each of the plurality of semiconductor chips comprises first and second transistors connected in series,
the first transistor and the second transistor have a common semiconductor substrate of the semiconductor chip,
a first electrode of the first transistor and a first electrode of the second transistor are a common electrode formed on a rear surface side of the semiconductor chip,
a second electrode of the first transistor is connected to the power input terminal and a second electrode of the second transistor is connected to one of the plurality of power output terminals, and
a control signal from the control IC is supplied to a control electrode of the first transistor and that of the second transistor via the line so that a connection between the power input terminal and the power output terminal is controlled,
wherein the first and second transistors are both n-channel power MOS transistors or both p-channel power MOS transistors,
wherein the first electrode is a drain electrode, the second electrode is a source electrode, and the control electrode is a gate electrode,
wherein parasitic diodes between source and drain of the first and second transistors are connected oppositely to each other.

* * * * *